(12) United States Patent
Miura et al.

(10) Patent No.: US 8,003,893 B2
(45) Date of Patent: Aug. 23, 2011

(54) MULTILAYER CERAMIC CIRCUIT BOARD HAVING PROTRUDING PORTION AND METHOD FOR MANUFACTURING THE SAME

(75) Inventors: Hisao Miura, Fukushima-ken (JP); Shinji Murata, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/145,802

(22) Filed: Jun. 25, 2008

(65) Prior Publication Data

US 2009/0056978 A1 Mar. 5, 2009

(30) Foreign Application Priority Data

Sep. 5, 2007 (JP) ................................. 2007-230447

(51) Int. Cl.
*H05K 1/03* (2006.01)
(52) U.S. Cl. ...................... 174/255; 174/258; 174/251
(58) Field of Classification Search ................. 174/251, 174/141 R, 96, 98, 105 R, 109, 120 R, 120 C, 174/146, 150, 183, 184, 255, 258, 250; 361/271; 29/829

See application file for complete search history.

(56) References Cited

U.S. PATENT DOCUMENTS

| | | | | |
|---|---|---|---|---|
| 5,573,808 A * | 11/1996 | Gruenwald et al. | ............ | 427/79 |
| 5,576,630 A * | 11/1996 | Fujita | ............ | 324/760 |
| 5,876,536 A * | 3/1999 | Kumar et al. | ............ | 156/89.11 |
| 6,180,531 B1 * | 1/2001 | Matsumoto et al. | ............ | 438/706 |
| 6,252,176 B1 * | 6/2001 | Kuramochi et al. | ............ | 174/255 |
| 6,255,600 B1 * | 7/2001 | Schaper | ............ | 174/255 |
| 6,525,467 B1 * | 2/2003 | Eida et al. | ............ | 313/506 |
| 6,777,622 B2 * | 8/2004 | Ueno et al. | ............ | 174/262 |
| 7,038,143 B2 * | 5/2006 | Utsumi et al. | ............ | 174/258 |
| 2002/0166694 A1 * | 11/2002 | Nishide et al. | ............ | 174/255 |
| 2003/0070833 A1 * | 4/2003 | Barth et al. | ............ | 174/250 |
| 2004/0231151 A1 * | 11/2004 | Nakatani et al. | ............ | 29/830 |
| 2005/0236180 A1 * | 10/2005 | Sarma et al. | ............ | 174/256 |

FOREIGN PATENT DOCUMENTS

JP 2003-055055 2/2003

* cited by examiner

*Primary Examiner* — Tuan T Dinh
*Assistant Examiner* — Steven Sawyer
(74) *Attorney, Agent, or Firm* — Brinks Hofer Gilson & Lione (57) ABSTRACT

A multilayer ceramic circuit board includes ceramic wiring layers which are stacked together, one or two or more lifting layers which have a planar shape and which are disposed as an inner layer inside the stacked ceramic wiring layers or as a lower layer lower than a bottom ceramic wiring layer, and a protruding portion formed on a surface of a top ceramic wiring layer due to the disposition of the one or two or more lifting layers. The protruding portion smoothly protrudes and has a large area and high flatness. The multilayer ceramic circuit board is formed by disposing lifting layers as an inner layer of a plurality green sheets or as a lower layer lower than a bottom green sheet, and firing under pressure the resulting laminate in a state constrained by an elastic constraining sheet and a rigid constraining sheet.

14 Claims, 6 Drawing Sheets

PRIOR ART

FIG. 9

PRIOR ART

FIG. 10

PRIOR ART

FIG. 11

PRIOR ART

FIG. 12

PRIOR ART

MULTILAYER CERAMIC CIRCUIT BOARD HAVING PROTRUDING PORTION AND METHOD FOR MANUFACTURING THE SAME

CLAIM OF PRIORITY

This application claims benefit of the Japanese Patent Application No. 2007-230447 filed on Sep. 5, 2007, which is hereby incorporated by reference in its entirety.

BACKGROUND OF THE INVENTION

1. Field of the Invention

The present invention relates to a multilayer ceramic circuit board and a method for manufacturing the multilayer ceramic circuit board. More particularly, the invention relates to a multilayer ceramic circuit board which is suitable for use when protruding portions are provided on the surface of the multilayer ceramic circuit board, and a method for manufacturing the multilayer ceramic circuit board.

2. Description of the Related Art

Figure 8:
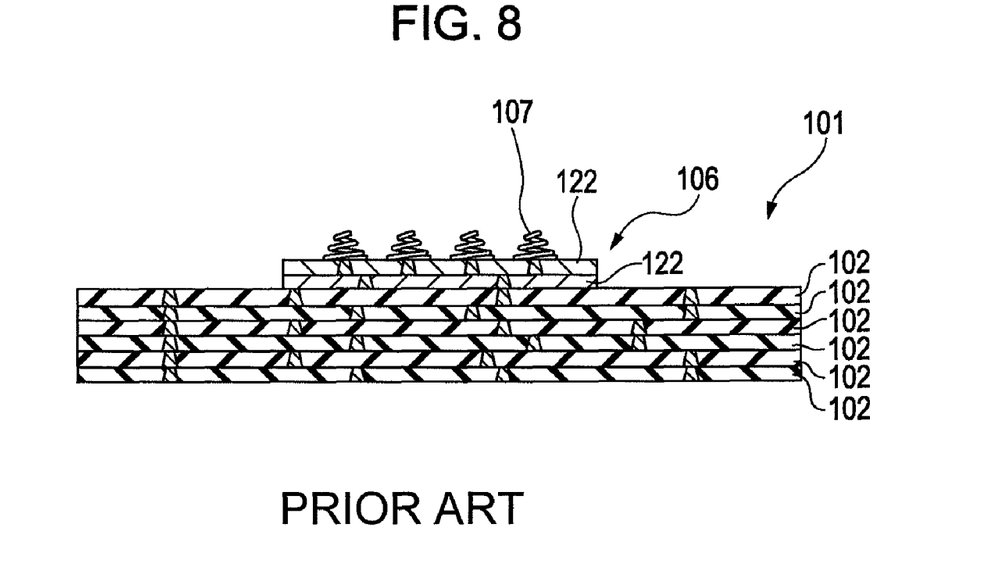
FIG. 8 is a longitudinal sectional view showing an example of a multilayer ceramic circuit board according to the related art.

FIG. 8 shows an example of a multilayer ceramic circuit board 101 according to the related art. The multilayer ceramic circuit board 101 is formed by stacking a plurality of ceramic wiring layers 102. A protruding portion 106 is disposed on the surface of the multilayer ceramic circuit board 101 so that contacts 107, such as ones shown in FIG. 8, and a quartz oscillator 108, such as one shown in FIG. 9, can be mounted on the protruding portion 106.

For example, two widely used methods for forming the protruding portion 106 according to the related art are mentioned below. In a first method, as shown in FIG. 8, the protruding portion 106 is formed on the surface of the multilayer ceramic circuit board 101 by stacking a plurality of ceramic sheets 122 that are smaller than the ceramic wiring layers 102.

Figure 9:
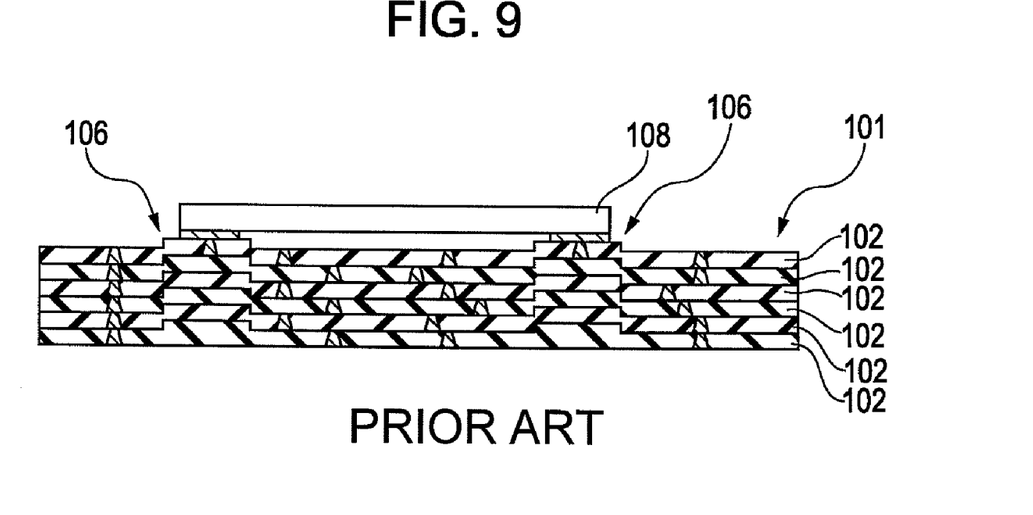
FIG. 9 is a longitudinal sectional view showing another example of a multilayer ceramic circuit board according to the related art.
Figure 10:
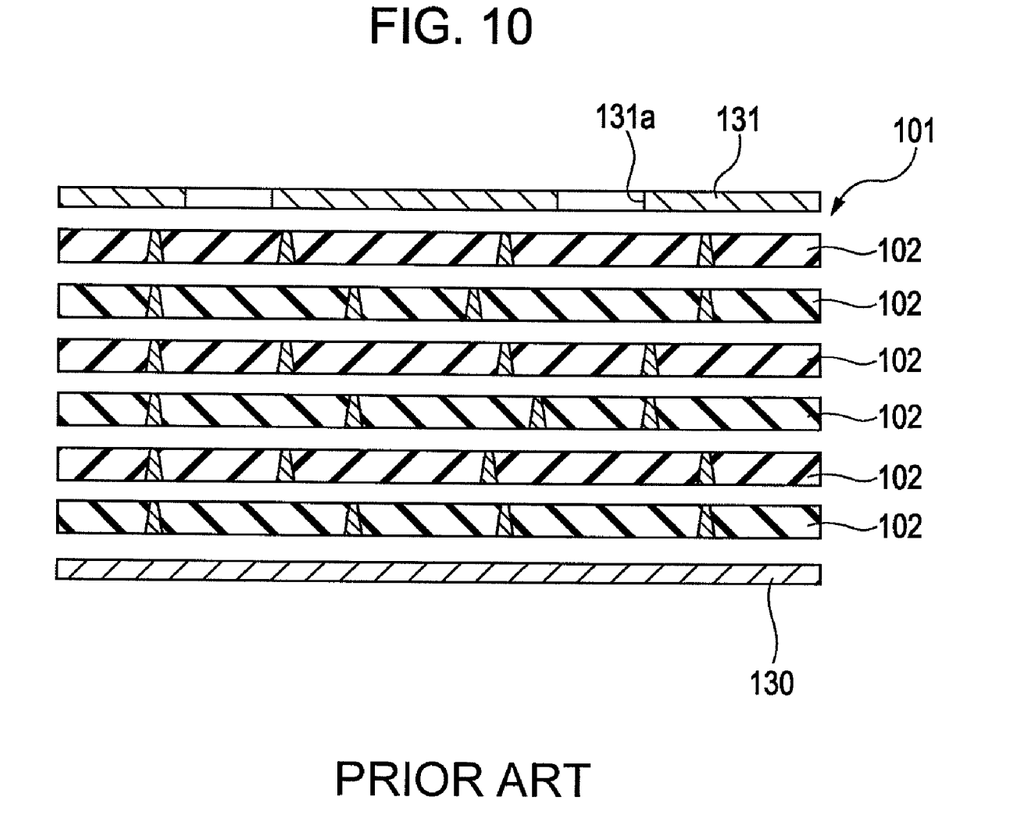
FIG. 10 is a longitudinal sectional view showing a state before application of pressure in a process for manufacturing a multilayer ceramic circuit board according to the related art.
Figure 11:
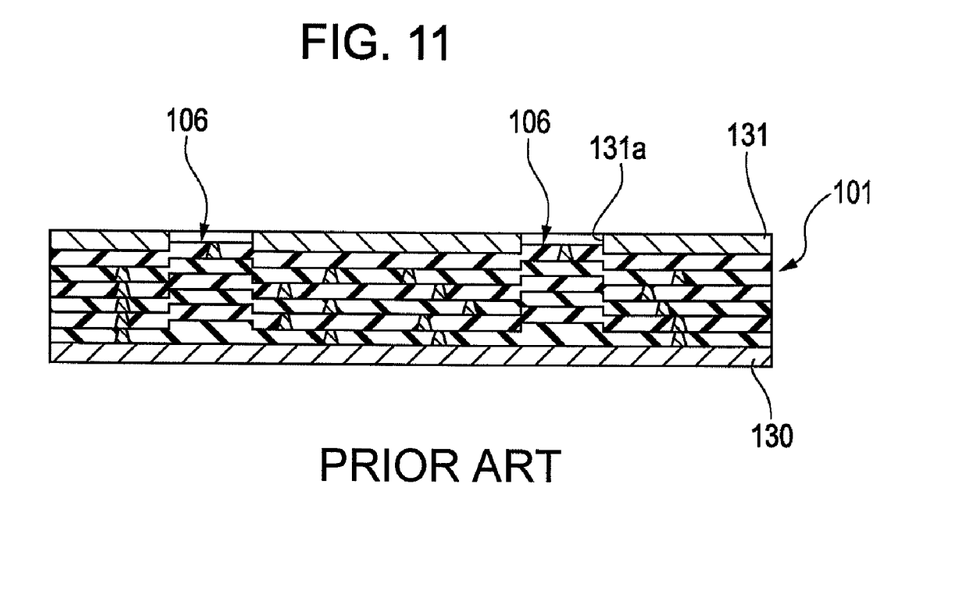
FIG. 11 is a longitudinal sectional view showing a state after application of pressure in the process for manufacturing a multilayer ceramic circuit board according to the related art.

In a second method, as shown in FIG. 10, a heat-resistant, constraining green sheet (hereinafter referred to as "recessed constraining sheet") 131 having recessed portions 131a at positions facing protrusion portions 106 and a planar heat-resistant, constraining green sheet (hereinafter referred to as "planar constraining sheet") 130 are prepared. The recessed constraining sheet 131 is allowed to abut on a first surface of the unfired multilayer ceramic circuit board 101, the planar constraining sheet 130 is allowed to abut on a second surface of the unfired multilayer ceramic circuit board 101, and then the multilayer ceramic circuit board 101 is fired under pressure. During the firing process under pressure, the multilayer ceramic circuit board 101 is constrained by the recessed constraining sheet 131 and the planar constraining sheet 130. Consequently, when the firing process under pressure is completed, as shown in FIGS. 9 and 11, the surface of the multilayer ceramic circuit board 101 swells out into the recessed portions 131a of the recessed constraining sheet 131, and thus protruding portions 106 are formed on the surface of the multilayer ceramic circuit board 101.

In the first method for forming the protruding portion 106, however, as shown in FIG. 8, since the side of the protruding portion 106 is steep, it is not possible to dispose a wiring pattern continuously so as to extend from the region provided with the protruding portion 106 to the region not provided with the protruding portion 106 via the side of the protruding portion 106, which is a problem.

Figure 12:
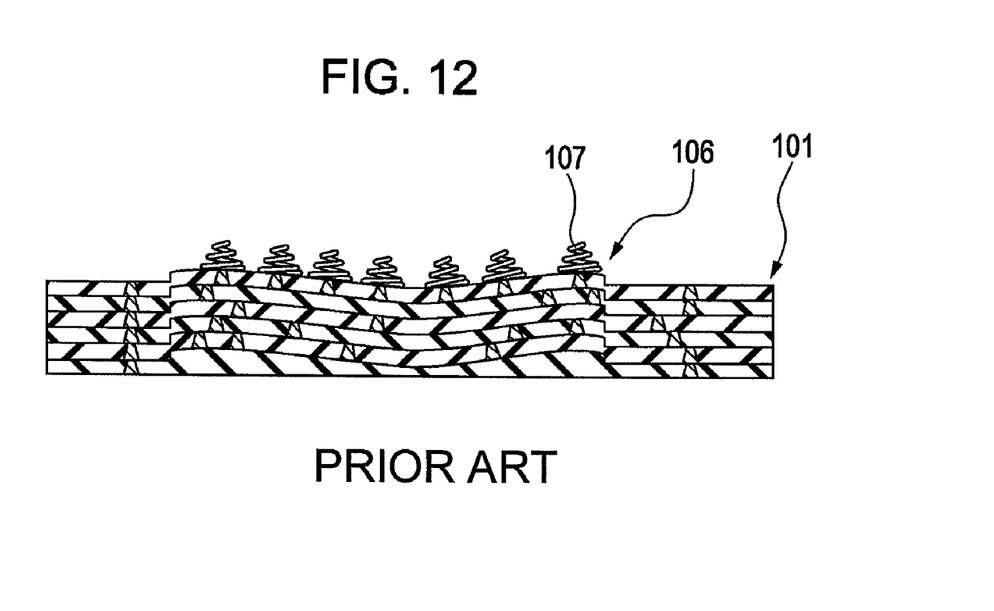
FIG. 12 is a longitudinal sectional view showing a state in which a protruding surface of a protruding portion is formed over a wide range on a multilayer ceramic circuit board according to the related art.

Furthermore, in the second method for forming the protruding portions 106, the protruding portions 106 are protruded by pressure deformation. There is a limit to the amount of deformation caused by the pressure deformation. Therefore, although a protruding portion 106 can be formed appropriately when the protruding portion 106 is small in area as shown in FIG. 9, pressure deformation cannot be performed appropriately when the protruding portion 106 that is large in area is formed as shown in FIG. 12. Consequently, in the second method for forming the protruding portions 106, the surface flatness of the protruding portion-formed surface decreases. When contacts 107 shown in FIG. 12 or quartz oscillators (not shown) are disposed on the protruding portion-formed surface, a difference in height may occur in the contacts 107 or the quartz oscillators, which is a problem.

SUMMARY

According to a first aspect, a multilayer ceramic circuit board includes a plurality of ceramic wiring layers which are stacked together; one or two or more lifting layers which have a planar shape, which are smaller than the ceramic wiring layers, and which are disposed as an inner layer located inside the stacked ceramic wiring layers or as a lower layer lower than a bottom ceramic wiring layer; and a protruding portion formed on a surface of a top ceramic wiring layer due to the disposition of the one or two or more lifting layers.

In the multilayer ceramic circuit board according to the first aspect, the one or two or more lifting layers lying below swell the top ceramic wiring layer such that the protruding portion protrudes, and therefore the side of the protruding portion can be smoothly inclined. Furthermore, since the one or two or more lifting layers used for protruding the protruding portion have a planar shape, the protruding portion-formed surface can have high flatness, regardless of the size of protruding portion-formed surface corresponding to the top surface of the protruding portion.

According to a second aspect, a method for manufacturing a multilayer ceramic circuit board includes: disposing one or two or more lifting layers on a first surface or a second surface of some of a plurality of green sheets by applying a conductive paste or a glass paste or by attaching a ceramic sheet composed of the same ceramic as the green sheets, the lifting layers being smaller than the green sheets; forming a green sheet laminate by arranging the one or two or more lifting layers disposed on the plurality of green sheets as an inner layer between the adjacent green sheets or as a lower layer lower than a bottom green sheet, then by stacking the plurality of green sheets, such that the lifting layers overlap each other in the stacking direction if disposed on the plurality of green sheets; forming a protruding portion which protrudes upwards in a region provided with the lifting layers in the green sheet laminate by subjecting the green sheet laminate to isostatic pressing with a rigid constraining sheet being allowed to abut on the lower surface of the green sheet laminate, and an elastic constraining sheet being allowed to abut on the upper surface of the green sheet laminate so that the green sheets are pressure-bonded to each other, the elastic constraining sheet deforming along the surface of the green sheet laminate; and firing the green sheet laminate which has been subjected to pressure-bonding.

In the method for manufacturing the multilayer ceramic circuit board according to the second aspect, it is possible to manufacture a multilayer ceramic circuit board having a protruding portion which smoothly protrudes from the surface of the multilayer ceramic circuit board in a wide area.

According to the first and second aspects of the present invention, in the multilayer ceramic circuit board and the method for manufacturing the multilayer ceramic circuit board, since a protruding portion is formed using a planar lifting layer or layers and increasing the number of stacked layers partially in the multilayer ceramic circuit board, it is possible to provide a multilayer ceramic circuit board in which the protruding portion smoothly protrudes and the flatness is increased.

DESCRIPTION OF THE EMBODIMENTS

A multilayer ceramic circuit board and a method for manufacturing the multilayer ceramic circuit board according to an embodiment of the present invention will be described below with reference to the drawings.

Figure 1:
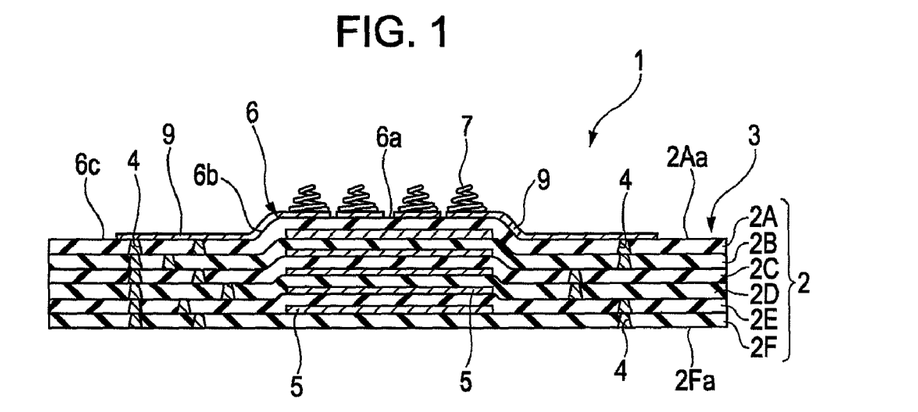
FIG. 1 is a longitudinal sectional view showing a multilayer ceramic circuit board according to an embodiment.
Figure 2:
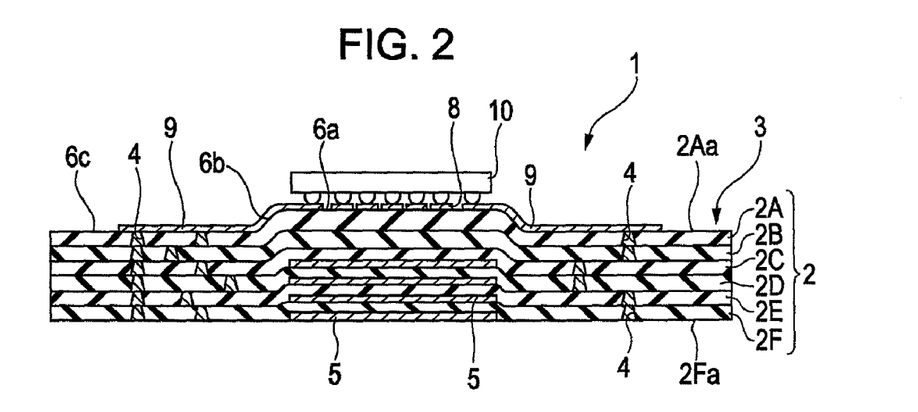
FIG. 2 is a longitudinal sectional view showing a multilayer ceramic circuit board according to the embodiment in which connecting terminals are provided instead of contacts.

FIGS. 1 and 2 are each a longitudinal sectional view showing a multilayer ceramic circuit board 1 according to the embodiment. As shown in FIG. 1, the multilayer ceramic circuit board 1 includes a plurality of ceramic wiring layers 2 and lifting layers 5.

The plurality of ceramic wiring layers 2 are stacked vertically as shown in FIG. 1. In the multilayer ceramic circuit board 1 according to this embodiment, six ceramic wiring layers 2 are stacked. A top ceramic wiring layer 2A is designated as a first ceramic wiring layer 2A, and a bottom ceramic wiring layer 2F is designated as a sixth ceramic wiring layer 2F. The ceramic wiring layers are designated from the top to the bottom by a first ceramic wiring layer 2A, a second ceramic wiring layer 2B, . . . , a sixth ceramic wiring layer 2F. The number of ceramic wiring layers 2 to be stacked can be appropriately changed according to the specifications of the multilayer ceramic circuit board 1.

Referring to FIG. 1, the ceramic wiring layers 2 constitute a ceramic substrate 3 and have vias 4 and internal electrode layers (internal interconnect lines), which are not shown. The ceramic substrate 3 is a low-temperature co-fired ceramic (LTCC) substrate, composed of alumina and glass, and has a planar shape. Since the firing temperature of the ceramic substrate 3 is low at 900° C. or less, the vias 4 and the internal electrode layers are formed using a low-melting-point, good conducting metal, such as Au, Ag, or Cu.

Figure 3:
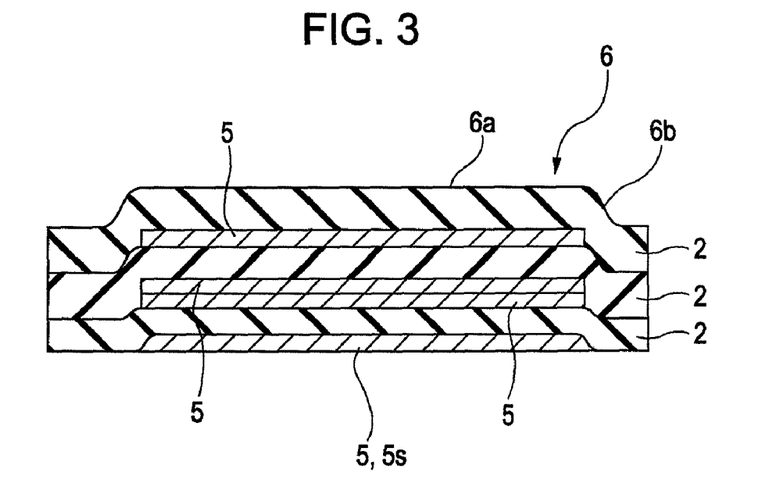
FIG. 3 is a partially enlarged longitudinal sectional view showing an example of arrangement of lifting layers according to the embodiment.

As shown near the center of FIG. 1, the lifting layers 5 are disposed between stacked ceramic wiring layers 2, namely, disposed as inner layers located inside the stacked plurality of ceramic wiring layers 2. Alternatively, as shown near the center of FIG. 2, a lifting layer 5 may be disposed as a lower layer lower than the bottom ceramic wiring layer 2F (on a second surface 2Fa of the bottom ceramic wiring layer 2F). As shown in FIG. 1 or 2, in the multilayer ceramic circuit board 1 according to this embodiment, one lifting layer 5 is disposed as an inner layer located between each of the adjacent ceramic wiring layers 2 or as a lower layer lower than the bottom ceramic wiring layer 2F. However, instead of using a plurality of lifting layers 5, only one lifting layer 5 may be used. Also, as shown in FIG. 3, two or more lifting layers 5 may be disposed at the same position.

Furthermore, the plurality of lifting layers 5 have a planar shape smaller than the ceramic wiring layers 2 as shown in FIG. 1. Preferably, the lifting layers 5 have the same size. Also preferably, the plurality of lifting layers 5 are disposed so as to overlap each other in the stacking direction of the ceramic wiring layers 2.

Figure 4:
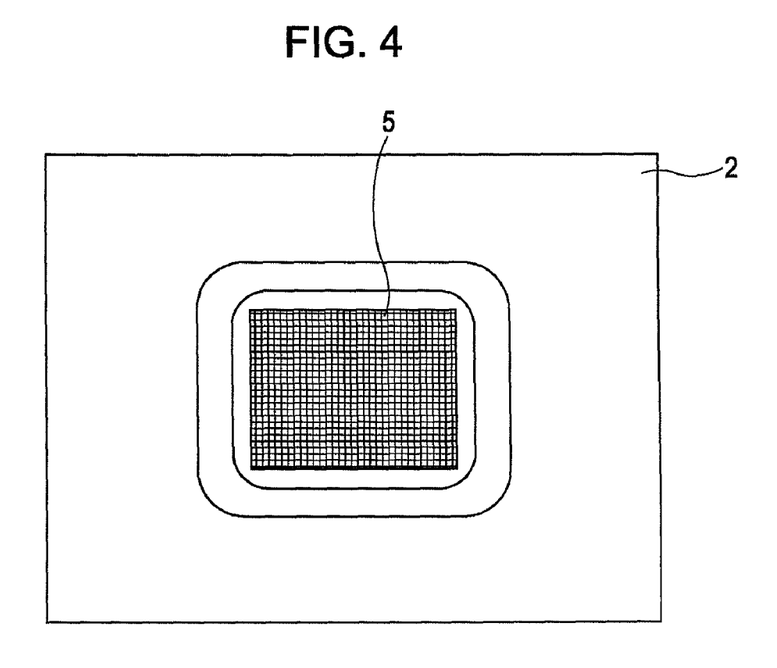
FIG. 4 is a plan view showing a lifting layer in the shape of a mesh according to the embodiment.

The lifting layers 5 may be composed of a metal, glass, or the same ceramic as the ceramic wiring layers 2 (namely, the same ceramic as the ceramic substrate 3; hereinafter simply referred to as the "ceramic"). When a plurality of lifting layers 5 are disposed as inner layers as in the multilayer ceramic circuit board 1 according to this embodiment, all of the lifting layers 5 may be composed of the same material, or the material for the lifting layers 5 may be appropriately changed according to the positions of the lifting layers 5. In such a case, each of the lifting layers 5 composed of a metal or glass is preferably in the shape of a mesh as shown in FIG. 4.

Furthermore, if the lifting layer 5 is composed of a ceramic, it is not necessary to shape the lifting layer 5 into a mesh. The reason for this is that even in a case where a ceramic lifting layer 5s is attached to the lower surface of the bottom ceramic wiring layer 2F as shown in FIG. 3, the ceramic lifting layer 5s comes into close contact with the bottom ceramic wiring layer 2F composed of the same material. That is, unlike the lifting layer 5 composed of a metal or glass, there is no possibility that the ceramic lifting layer 5s will be separated due to contact between different materials.

When a metal is used as the material for all or some of the lifting layers 5, as shown in FIG. 2, preferably, the lifting layer 5 composed of a metal is not disposed at least between the first ceramic wiring layer 2A and the second ceramic wiring layer 2B, but disposed between the adjacent ceramic wiring layers 2 located under the first and second ceramic layers 2A and 2B, namely, between the second ceramic wiring layer 2B and the third ceramic wiring layer 2C or lower. For example, preferably, a lifting layer 5 composed of a metal is disposed between the third ceramic wiring layer 2C and the fourth ceramic wiring layer 2D, and between the adjacent ceramic wiring layers below as shown in FIG. 2. Furthermore, when a lifting layer 5 composed of a metal is used, preferably, the lifting layer 5 composed of a metal is disposed in a region in which vias 4 or internal electrode layers are not formed, for example, disposed as a lower layer lower than the bottom ceramic wiring layer 2F. When the lifting layer 5 is composed of glass or ceramic, unlike a metal, there is no possibility that stray capacitance will be generated, and therefore, the lifting layer 5 composed of glass or ceramic may be disposed at any position.

As shown in FIG. 1, when the lifting layers 5 are disposed as inner layers inside the stacked ceramic wiring layers 2, a surface 2Aa of the top ceramic wiring layer 2A swells out over a wide range to form a protruding portion 6. In this specification, as shown in FIG. 1, the "top surface of the protruding portion 6" is designated as the "protruding portion-formed surface 6a", the "inclined surface located on the side of the protruding portion 6" is designated as the "side 6b of the protruding portion 6", and the "surface obtained by removing the protruding portion-formed surface 6b and the side 6b from the entire surface of the surface 2Aa of the top ceramic wiring layer 2A" is designated as the "protruding portion non-formed surface 6c".

In the multilayer ceramic circuit board 1 according to this embodiment, a plurality of contacts 7 such as ones shown in FIG. 1 or a plurality of connecting terminals 8 such as ones shown in FIG. 2 are disposed on the protruding portion-formed surface 6a. The contacts 7 may have a shape selected from various shapes, such as a three-dimensional spiral shape, a plane spiral shape, and a bump shape. As shown in FIG. 1, the contacts 7 according to this embodiment have a three-dimensional spiral shape, in which the flatness of the surface provided with the contacts 7, namely, the protruding portion-formed surface 6a greatly affects the contact state of the contacts 7.

Figure 5:
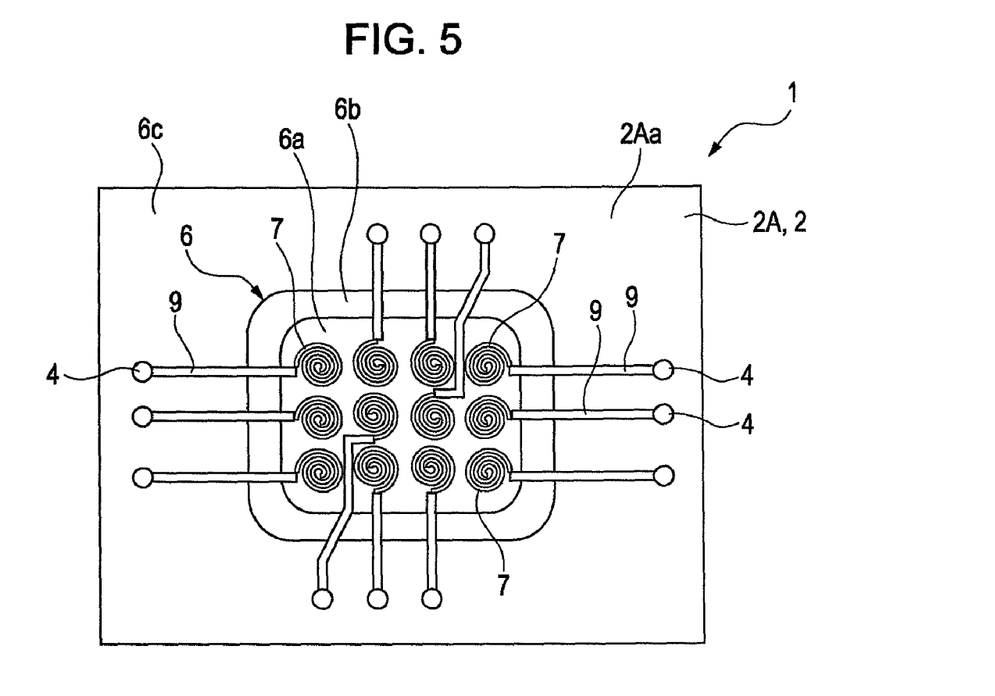
FIG. 5 is a plan view showing a multilayer ceramic circuit board according to the embodiment.

Furthermore, in the multilayer ceramic circuit board 1 according to this embodiment, as shown in FIG. 1, 2, or 5, the surface 2Aa of the top ceramic wiring layer 2A is provided with wiring patterns 9. The wiring patterns 9 extend from the protruding portion-formed surface 6a to the protruding portion non-formed surface 6c. One end of each wiring pattern 9 is connected to each of the plurality of contacts 7 disposed on the protruding portion-formed surface 6a (FIGS. 1 and 5) or the connecting terminals 8 (FIG. 2), and the other end is connected to each of a plurality of vias 4 formed in the protruding portion non-formed surface 6c.

As shown in FIG. 1 or 2, preferably, the plurality of vias 4 are disposed in a region other than the region provided with the protruding portion-formed surface 6a and the side 6b, namely, in a region other than the region provided with the protruding portion 6 (a region provided with the protruding portion non-formed surface 6c) in the stacking direction of the ceramic wiring layers 2. Also preferably, the internal electrode layers of the ceramic wiring layers 2 are disposed in a region other than the region provided with the protruding portion 6 (a region provided with the protruding portion non-formed surface 6c) in the stacking direction of the ceramic wiring layers 2. However, the above description does not deny that the vias 4 and the internal electrode layers are formed in the region provided with the protruding portion 6 in the stacking direction of the ceramic wiring layers 2.

A method for manufacturing a multilayer ceramic circuit board 1 will now be described with reference to FIGS. 6 and 7.

Figure 6:
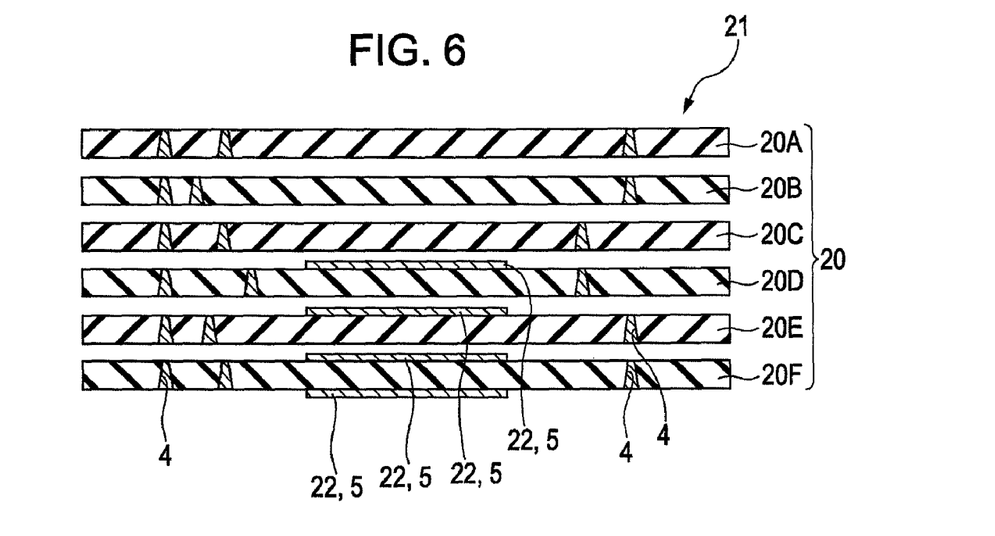
FIG. 6 is a longitudinal sectional view showing steps a and b of a method for manufacturing a multilayer ceramic circuit board according to the embodiment.

In step a (disposition step), as shown in FIG. 6, a conductive paste 22 or a glass paste 22 is applied to, or a ceramic sheet (green sheet, to be exact) 22 composed of the same ceramic as green sheets 20 is attached to a first surface or a second surface of each of the lower three (some) green sheets 20D, 20E, and 20F among six (a plurality of) green sheets 20. The size (after firing under pressure) of the green sheets 20 is set to be about 70 mm in length, about 70 mm in width, and about 80 μm in thickness. The green sheets 20 are subjected to a punching process to form via holes, and a conductive paste is applied to the inside of the via holes, thereby preparing the formation of vias 4.

Furthermore, the size (after firing under pressure) of the conductive paste 22, the glass paste 22, or the predetermined ceramic sheets 22 to be applied or attached is set to be about 17.5 mm in length, about 17.5 mm in width, and about 10 μm in thickness. The conductive paste 22, the glass paste 22, or the predetermined ceramic sheet 22 is not applied or attached to the surface of the top green sheet 20A. In such a manner, in step a (disposition step), one or two or more lifting layers 5 (before firing) are disposed on a first surface or a second surface of some or the plurality of green sheets 20, the lifting layers 5 being smaller than the green sheets 20.

In step b (stacking step), as shown in FIG. 6, after arranging the lifting layers 5 as an inner layer or as a bottom layer (after completion of step a (deposition step)), such that the lifting layers 5 overlap each other in the stacking direction if disposed on the plurality of green sheets 20, the plurality of green sheets 20 are stacked. Thereby, a green sheet laminate 21 is formed, the green sheet laminate 21 including the green sheets 20 and the conductive paste 22, the glass paste 22, or the predetermined ceramic sheets 22.

Figure 7:
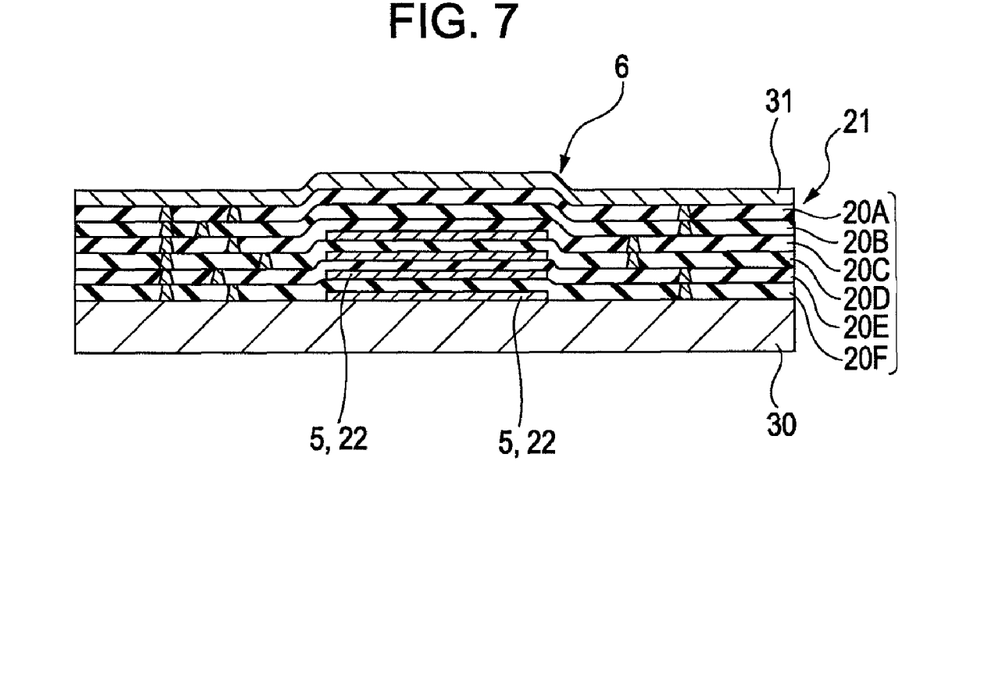
FIG. 7 is a longitudinal sectional view showing step c of the method for manufacturing a multilayer ceramic circuit board according to the embodiment.

In step c (pressing step), as shown in FIG. 7, the green sheet laminate 1 is subjected to isostatic pressing. In this step, a rigid constraining sheet 30 is allowed to abut on the lower surface of the green sheet laminate 21. Meanwhile, in order to form a protruding portion 6, an elastic constraining sheet 31 is allowed to abut on the upper surface of the green sheet laminate 21, the elastic constraining sheet 31 deforming along the surface of the green sheet laminate 21. As the rigid constraining sheet 30, for example, a high temperature co-fired ceramic (HTCC) substrate or a stainless used steel (SUS) sheet may be used. As the elastic constraining sheet 31, for example, a polyethylene terephthalate (PET) film may be used.

As the method for pressing the green sheet laminate 21, preferably, warm isostatic pressing (WIP), which is believed to be most suitable for pressing the green sheets 20, is used. The WIP profile is as follows: preheating for 15 minutes, prepressure of 10 MPa for 15 minutes, and main pressure of 30 MPa for 30 minutes. Thereby, the stacked green sheets 20 are pressure-bonded to each other. When the green sheets 20 are pressure-bonded to each other, with the elastic constraining sheet 31 on the upper side swelling out, a protruding portion 6 protrudes upwards in a region provided with the lifting layers 5 in the green sheet laminate 21.

In step d (firing step), the green sheet laminate 21 which has been subjected to pressure-bonding is fired. The firing temperature profile is as follows: the temperature is increased from 0° C. to 500° C. at about 70° C./h, from 500° C. to 550° C. at about 10° C./h, and from 550° C. to 860° C. at about 60° C./h, the temperature is held at about 860° C. for one hour, and then the temperature is decreased to near room temperature at about 80° C./h.

When contacts 7 or connecting terminals 8 such as ones shown in FIG. 1 or 2 are disposed on the protruding portion-formed surface 6a, these components are formed after step d (firing step). The contacts 7 and the connecting terminals 8 are formed by a known method, such as sputtering or plating. Furthermore, when wiring patterns 9 are formed on the surface 2Aa of the top ceramic wiring layer 2A as shown in FIG. 1 or 2, the wiring patterns 9 are formed by a known method, such as sputtering or plating.

By performing the steps described above, a multilayer ceramic circuit board 1 according to this embodiment is obtained.

The operational advantages of the multilayer ceramic circuit board 1 and the method for manufacturing the same will now be described with reference to FIGS. 1 to 7.

In the multilayer ceramic circuit board 1 according to this embodiment, as shown in FIG. 1 or 2, the planar lifting layers 5 are disposed as an inner layer or as a bottom layer in the stacked ceramic wiring layers 2. Since the lifting layers 5 partially swell the surface 2Aa of the top ceramic wiring layer 2A from below, unlike the protruding portion 106 (FIG. 8) according to the related art in which the ceramic sheets 122 are attached to the surface of the top ceramic wiring layer 102, it is possible to form the protruding portion 6 having a smoothly inclined side on the surface 2Aa of the top ceramic wiring layer 2A as shown in FIG. 1.

Furthermore, since the lifting layers 5 have a planar shape, as the size of the lifting layers 5 increase, the protruding portion-formed surface 6a increases proportionally. That is, even if the protruding portion-formed surface 6a is large to such a degree that the protruding portion-formed surface 6a cannot be formed with high flatness by the method for forming the protruding portion by pressure deformation according to the related art (refer to FIG. 12), it is possible to form the protruding portion-formed surface 6a with high flatness in this embodiment.

Furthermore, as shown in FIG. 1 or 2, when a plurality of lifting layers 5 are disposed, in the protruding portion 6, a region in which the number of lifting layers 5 stacked is largest in the stacking direction of the ceramic wiring layers 2 protrudes most. Accordingly, in this embodiment, a plurality of lifting layers 5 are formed with the same size and disposed so as to overlap each other in the stacking direction of the ceramic wiring layers 2. Consequently, the protruding portion 6 has a trapezoidal cross section, and in this embodiment, the size of the protruding portion-formed surface 6a can be set to be 16.8 mm in length, 16.8 mm in width, about 5 µm in flatness, and about 30 µm in protrusion height. Thus, in this embodiment, it is possible to form a protruding portion-formed surface 6a with high flatness in a large area and with large height while smoothly protruding the side of the protruding portion 6.

Although not shown in the drawings, if the size of the stacked lifting layers 5 shown in FIG. 1 gradually decreases with height, the size of the protruding portion-formed surface 6a decreases, and the resulting protruding portion 6 has a substantially triangular cross section (a trapezoidal cross section close to a triangular cross section, to be exact) in which the side 6b is gently inclined. The shape of the protruding portion 6, namely, the protruding portion 6 having a trapezoidal cross section with a large protruding portion-formed surface 6a or the protruding portion 6 having a substantially triangular cross section with a gently inclined side, may be selected depending on the number of contacts 7 or connecting terminals 8 to be disposed on the protruding portion-formed surface 6a and the formability of wiring patterns 9 formed on the side 6b of the protruding portion 6.

In this embodiment, as shown in FIG. 1, three-dimensional spiral contacts 7 are disposed on the protruding portion-formed surface 6a. With respect to the contacts 7 shown in FIG. 1 and the connecting terminals 8 shown in FIG. 2, unless the height of the contact portions are aligned, contact failure may occur between the contact portions and connecting terminals of another circuit (e.g., a semiconductor chip 10 shown in FIG. 2).

There may be a case in which the height (thickness) of the connecting terminals 8 can be adjusted easily because of their simple rectangular or circular shape, and even if the protruding portion-formed surface 6a is slightly less flat, the flatness of the protruding portion-formed surface 6a is allowable by adjusting the height (thickness) of the connecting terminals 8. However, with respect to the three-dimensional spiral contacts 7 as ones shown in FIG. 1, since the shape thereof is complicated, it is difficult to adjust the height of the three-dimensional spiral contacts 7 according to the flatness of the protruding portion-formed surface 6a.

However, in this embodiment, as shown in FIG. 1, it is possible to dispose the three-dimensional spiral contacts 7 (in which height adjustment is difficult) on the protruding portion-formed surface 6a. The reason for this is that since the protruding portion-formed surface 6a is large and flat, the height (ends) of the contacts 7 can be easily aligned.

Furthermore, in this embodiment, as shown in FIG. 1, vias 4 are disposed in a region other than the region provided with the protruding portion 6 in the stacking direction of the ceramic wiring layers 2. The region provided with the vias 4 tends to slightly more protrude upward in the stacking direction than the region not provided with the vias 4. Consequently, if vias 4 are disposed in the region provided with the protruding portion 6 (region including the protruding portion-formed surface 6a and the side 6b) in the stacking direction, the protruding portion-formed surface 6a which has been planarized by the lifting layers 5 is roughened. That is, by avoiding the formation of the vias 4 in the region provided with the protruding portion 6, it is possible to prevent the flatness of the protruding portion-formed surface 6a from being decreased.

In order to connect the contacts 7 shown in FIG. 1 or the connecting terminals 8 shown in FIG. 2 disposed on the protruding portion-formed surface 6a to the vias 4 of the ceramic wiring layers 2, as shown in FIG. 1, 2, or 5, the wiring patterns 9 extend from the protruding portion 6 to the protruding portion non-formed surface 6c in the surface 2Aa of the top ceramic wiring layer 2A. The wiring patterns 9 are formed by sputtering in many cases. The side of the protruding portion 6 according to the related art is steep (inclined by substantially 90 degrees) (refer to FIGS. 8 and 9), and it is very difficult to dispose wiring patterns on the side of the protruding portion 6. Therefore, the only possible method is to form vias 4 in the protruding portion 6, and the contacts 7 shown in FIG. 1 or the connecting terminals 8 shown in FIG. 2 are connected through the vias 4 to the internal electrode layers (not shown) of the ceramic wiring layer 2.

Unlike the related art, the side 6b of the protruding portion 6 according to this embodiment is gently inclined as shown in FIG. 1, and consequently, wiring patterns 9 can also be disposed on the side 6b of the protruding portion 6. As shown in FIG. 5, if the wiring patterns 9 can be formed on the surface 2Aa of the top ceramic wiring layer 2A, the contacts 7 shown in FIG. 1 or the connecting terminals 8 shown in FIG. 2 can be connected to vias 4 at any desired position. Thus, the freedom in wiring can be increased in the multilayer ceramic circuit board 1 as a whole.

The material for the lifting layers 5 for forming the protruding portion 6 can be selected from a metal, glass, and a ceramic. Since the materials have their own characteristics, the materials may be selected in view of the characteristics of the materials. For example, all of the plurality of lifting layers 5 may be composed of the same material, or some of the lifting layers 5 may be composed of a material different from the other lifting layers 5.

When a lifting layer 5 is composed of a metal, the metal lifting layer 5 functions as a shield, and thus electromagnetic waves externally or internally generated can be blocked. Therefore, it is possible to prevent exogenous noise from mixing in an electronic component, for example, a semiconductor chip 10 shown in FIG. 2, disposed in the stacking direction of the lifting layers 5.

However, the metal lifting layer 5 is disadvantageously coupled with the contacts 7 shown in FIG. 1 or the connecting terminals 8 shown in FIG. 2 disposed on the protruding portion-formed surface 6a or an electronic component (e.g., a semiconductor chip 10) shown in FIG. 2 to easily generate stray capacitance. Consequently, in the multilayer ceramic circuit board 1 according to this embodiment, as shown in FIG. 2, the metal lifting layer 5 is not disposed at least between the first ceramic wiring layer 2A and the second ceramic wiring layer 2B, and is disposed between the ceramic wiring layers 2 located therebelow, for example, in the example shown in FIG. 2, between the third ceramic wiring layer 2C and the fourth ceramic wiring layer 2D, and below. Since the metal lifting layer 5 is distant from the protruding portion-formed surface 6a, it is possible to reduce the stray capacitance that may be generated between the metal lifting layer 5 and the contacts 7 shown in FIG. 1 or the connecting terminals 8 shown in FIG. 2 disposed on the protruding portion-formed surface 6a, or the electronic component (e.g., semiconductor chip 10) shown in FIG. 2.

As the distance between the metal lifting layer 5 and the contacts 7 shown in FIG. 1 or the connecting terminals 8 or the electronic component (e.g., semiconductor chip 10) shown in FIG. 2 increases, the stray capacitance decreases. Therefore, preferably, the metal lifting layer 5 is disposed as a lower layer lower than the bottom ceramic wiring layer 2F, as shown in FIG. 2. If the metal lifting layer 5 is disposed as a lower layer lower than the bottom ceramic wiring layer 2F, the stray capacitance can be reduced, and also it is possible to prevent the metal lifting layer 5 from coming into contact with internal electrode layers (interconnect lines) disposed inside the multilayer ceramic circuit board 1, resulting in short-circuiting.

When the lifting layers 5 are composed of glass, stray capacitance can be prevented from being generated between the lifting layers 5 or between an electronic component and the lifting layers 5.

Since the metal lifting layers 5 or the glass lifting layers 5 are composed of a different material from the ceramic substrate 3 including the ceramic wiring layers 2, if formed in a planar shape, the metal lifting layers 5 or the glass lifting layers 5 are easily separated from the ceramic wiring layers 2. In particular, when the lifting layer 5 is disposed as a bottom layer of the multilayer ceramic circuit board 1 and is not disposed between the ceramic wiring layers 2, if the lifting layer 5 is separated, the lifting layer 5 falls off from the multilayer ceramic circuit board 1.

Consequently, in the multilayer ceramic circuit board 1 according to this embodiment, as shown in FIG. 4, the metal lifting layer 5 or the glass lifting layer 5 is in the shape of a mesh. Thereby, since the mesh-shaped lifting layer 5 cuts into the ceramic wiring layer 2, it is possible to prevent the lifting layer 5 from being separated from the ceramic wiring layer 2. The lifting layer 5 shown in FIG. 4 is entirely formed into a mesh shape. However, when improvement in the flatness of the lifting layer 5 is desired, preferably, the lifting layer 5 is partially formed into a mesh shape, for example, preferably, only the peripheral portion is formed into a mesh shape.

When the separation of the lifting layers 5 causes a problem, preferably, the lifting layers 5 are composed of a ceramic. When the lifting layers 5 are composed of the ceramic, since the lifting layer 5 is composed of the same material as the ceramic substrate 3 including the ceramic wiring layers 2, the lifting layers 5 are integrated into the ceramic substrate 3 and the separation of the lifting layers 5 from the ceramic wiring layers 2 can be easily prevented. Furthermore, as in the glass lifting layers 5, stray capacitance can be prevented from being generated between the lifting layers 5 or between an electronic component (e.g., a semiconductor chip 10 shown in FIG. 2) and the lifting layers 5.

The method for manufacturing the multilayer ceramic circuit board 1 according to this embodiment includes step a (disposition step), step b (stacking step), step c (pressing step), and step d (firing step). In step c (pressing step), as shown in FIG. 7, the rigid constraining sheet 30 is allowed to abut on the lower surface of the green sheet laminate 21, and the elastic constraining sheet 31 is allowed to abut on the surface 2Aa of the green sheet laminate 21 (on which the protruding portion 6 is formed). Even if the protruding portion 6 is formed, the elastic constraining sheet 31 deforms following the shape of the protruding portion 6 and abuts on the entire surface of the green sheet laminate 21. Therefore, the green sheet laminate 21 can be appropriately pressed when the green sheet laminate 21 is subjected to isostatic pressing. Thereby, it is possible to appropriately manufacture a multilayer ceramic circuit board 1 in which a protruding portion 6 smoothly protrudes on the surface of the multilayer ceramic circuit board 1 in a wide area.

In the multilayer ceramic circuit board 1 and the method for manufacturing the multilayer ceramic circuit board 1 according to this embodiment, since the number of layers stacked in the multilayer ceramic circuit board 1 is partially increased using planar lifting layers 5, it is possible to obtain the multilayer ceramic circuit board 1 in which the protruding portion 6 can be smoothly protruded and the flatness is increased.

The present invention is not limited to the embodiment, etc. described above, and various modifications can be made as necessary.

What is claimed is:

1. A multilayer ceramic circuit board comprising: a plurality of ceramic wiring layers that are stacked together; a plurality of lifting layers that have a planar shape, that are smaller than the ceramic wiring layers, and that are disposed as an inner layer located inside the stacked ceramic wiring layers or as a lower layer lower than a bottom ceramic wiring layer, and which are disposed so as to overlap each other in the stacking direction of the ceramic wiring layers; a protruding portion formed on a surface of a top ceramic wiring layer due to the disposition of the plurality of lifting layers; and a plurality of contacts for contacting with a terminal of an electronic component, the plurality of contacts formed on the protruding portion-formed surface; wherein the protruding portion-formed surface is formed as a flat surface, wherein the plurality of lifting layers have the same size.

2. The multilayer ceramic circuit board according to claim 1, wherein the top ceramic wiring layer has a wiring pattern that extends from a first end disposed on the protruding portion-formed surface of the top ceramic wiring layer to a second end disposed on a non-protruding portion surface of the top ceramic wiring layer, wherein the first end is in connection with the plurality of contacts.

3. The multilayer ceramic circuit board according to claim 1, wherein the plurality of lifting layers are composed of a metal.

4. The multilayer ceramic circuit board according to claim 1, wherein the plurality of lifting layers are composed of glass.

5. The multilayer ceramic circuit board according to claim 1, wherein the plurality of lifting layers are composed of the same ceramic as the ceramic wiring layers.

6. The multilayer ceramic circuit board according to claim 1, wherein the plurality of lifting layers are composed of at least one of a metal, glass, or the same ceramic as the ceramic wiring layers.

7. The multilayer ceramic circuit board according to claim 1, wherein the plurality of ceramic wiring layers have a via in a non-protruding portion of the multilayer ceramic circuit board.

8. The multilayer ceramic circuit board according to claim 1, wherein each contact of the plurality of contacts comprises a three-dimensional spiral.

9. A method for manufacturing a multilayer ceramic circuit board comprising:
- step a of disposing a plurality of lifting layers on a first surface or a second surface of some of a plurality of green sheets by applying one of a conductive paste or a glass paste or by attaching a ceramic sheet composed of the same ceramic as the green sheets, the lifting layers being smaller than the green sheets and wherein the plurality of lifting layers have the same size;
- step b of forming a green sheet laminate by arranging the plurality of lifting layers disposed on the plurality of green sheets as an inner layer between the adjacent green sheets or as a lower layer lower than a bottom green sheet, then by stacking the plurality of green sheets, such that the lifting layers overlap each other in the stacking direction when disposed on the plurality of green sheets;
- step e of forming a protruding portion which protrudes upwards in a region provided with the lifting layers in the green sheet laminate by subjecting the green sheet laminate to isostatic pressing with a rigid constraining sheet being allowed to abut on the lower surface of the green sheet laminate, and an elastic constraining sheet being allowed to abut on the upper surface of the green sheet laminate so that the green sheets are pressure-bonded to each other, the elastic constraining sheet deforming along the surface of the green sheet laminate; and
- step d of firing the green sheet laminate which has been subjected to pressure-bonding.

10. The multilayer ceramic circuit board according to claim 2, wherein the size of the plurality of lifting layers decreases as the height of the plurality of lifting layers increases.

11. The multilayer ceramic circuit board according to claim 3, wherein the lifting layer composed of a metal is not disposed at least between a first ceramic wiring layer and a second ceramic wiring layer and is disposed between the adjacent ceramic wiring layers located thereunder, provided that the first ceramic wiring layer corresponds to the top ceramic wiring layer and the ceramic wiring layers are numbered in the stacking order from the top ceramic wiring layer.

12. The multilayer ceramic circuit board according to claim 3, wherein the lifting layer composed of a metal is disposed as a lower layer lower than the bottom ceramic wiring layer.

13. The multilayer ceramic circuit board according to claim 3, wherein the lifting layer composed of a metal is in the shape of a mesh.

14. The multilayer ceramic circuit board according to claim 4, wherein the lifting layer composed of a glass is in the shape of a mesh.

* * * * *